United States Patent
Chen et al.

(10) Patent No.: US 10,741,490 B2
(45) Date of Patent: Aug. 11, 2020

(54) DEVICE AND PACKAGE STRUCTURE

(71) Applicant: Taiwan Semiconductor Manufacturing Co., Ltd., Hsin-Chu (TW)

(72) Inventors: Hsien-Wei Chen, Hsinchu (TW); An-Jhih Su, Taoyuan (TW); Li-Hsien Huang, Hsinchu County (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 22 days.

(21) Appl. No.: 16/147,897

(22) Filed: Oct. 1, 2018

(65) Prior Publication Data

US 2019/0035730 A1 Jan. 31, 2019

Related U.S. Application Data

(63) Continuation of application No. 14/724,817, filed on May 29, 2015, now Pat. No. 10,090,241.

(51) Int. Cl.
*H01L 23/522* (2006.01)
*H01L 23/00* (2006.01)
(Continued)

(52) U.S. Cl.
CPC .......... *H01L 23/5226* (2013.01); *H01L 24/19* (2013.01); *H01L 24/20* (2013.01); *H01L 25/105* (2013.01); *H01L 25/50* (2013.01); *H01L 21/311* (2013.01); *H01L 21/568* (2013.01); *H01L 23/3128* (2013.01); *H01L 25/0657* (2013.01); *H01L 2224/04105* (2013.01); *H01L 2224/12105* (2013.01); *H01L 2224/32145* (2013.01); *H01L 2224/32225* (2013.01); *H01L 2224/48091* (2013.01); *H01L 2224/48227* (2013.01); *H01L 2224/73265* (2013.01); *H01L 2224/73267* (2013.01); *H01L 2224/92244* (2013.01); *H01L 2225/0651* (2013.01); *H01L 2225/06568* (2013.01); *H01L 2225/1035* (2013.01); *H01L 2225/1041* (2013.01);
(Continued)

(58) Field of Classification Search
None
See application file for complete search history.

(56) References Cited

U.S. PATENT DOCUMENTS

2006/0191711 A1* 8/2006 Cho ................... H01L 23/5389
174/260
2010/0022071 A1* 1/2010 Arita ................... H01L 21/3043
438/463

(Continued)

*Primary Examiner* — Michelle Mandala
(74) *Attorney, Agent, or Firm* — JCIPRNET

(57) ABSTRACT

Device, package structure and method of forming the same are disclosed. The device includes a die encapsulated by an encapsulant, a conductive structure aside the die, and a dielectric layer overlying the conductive structure. The conductive structure includes a through via in the encapsulant, a redistribution line layer overlying the through via, and a seed layer overlying the redistribution line layer. The dielectric layer includes an opening, wherein the opening exposes a surface of the conductive structure, the opening has a scallop sidewall, and an included angle between a bottom surface of the dielectric layer and a sidewall of the opening is larger than about 60 degrees.

20 Claims, 15 Drawing Sheets

(51) Int. Cl.
*H01L 25/10* (2006.01)
*H01L 25/00* (2006.01)
H01L 21/311 (2006.01)
H01L 23/31 (2006.01)
H01L 25/065 (2006.01)
H01L 21/56 (2006.01)

(52) U.S. Cl.
CPC ............. *H01L 2225/1058* (2013.01); *H01L 2924/15311* (2013.01); *H01L 2924/181* (2013.01)

(56) References Cited

U.S. PATENT DOCUMENTS

| | | | | |
|---|---|---|---|---|
| 2010/0301474 | A1* | 12/2010 | Yang | H01L 21/6835 |
| | | | | 257/737 |
| 2011/0155433 | A1* | 6/2011 | Funaya | H01L 23/49827 |
| | | | | 174/258 |
| 2016/0233292 | A1* | 8/2016 | Chen | H01L 28/10 |

* cited by examiner

DEVICE AND PACKAGE STRUCTURE

CROSS-REFERENCE TO RELATED APPLICATION

This application is a divisional application of U.S. application Ser. No. 14/724,817, filed on May 29, 2015, and now allowed. The entirety of each of the above-mentioned patent applications is hereby incorporated by reference herein and made a part of this specification.

BACKGROUND

The semiconductor industry has experienced rapid growth due to continuous improvements in the integration density of various electronic components (i.e., transistors, diodes, resistors, capacitors, etc.). For the most part, this improvement in integration density has come from repeated reductions in minimum feature size, which allows more of the smaller components to be integrated into a given area.

These smaller electronic components also require smaller packages that utilize less area than previous packages. Some smaller types of packages for semiconductors include quad flat pack (QFP), pin grid array (PGA), ball grid array (BGA), flip chips (FC), three dimensional integrated circuits (3DICs), wafer level packages (WLPs), and package on package (PoP) devices. Package on package (PoP) technology is becoming increasingly popular for its ability to allow for denser integration of integrated circuits into a small overall package. In a package manufacturing process, forming openings for connectors plays a critical role. Therefore, the critical size of the opening for a package structure has drawn attention in the industry.

DETAILED DESCRIPTION

Figure 1:
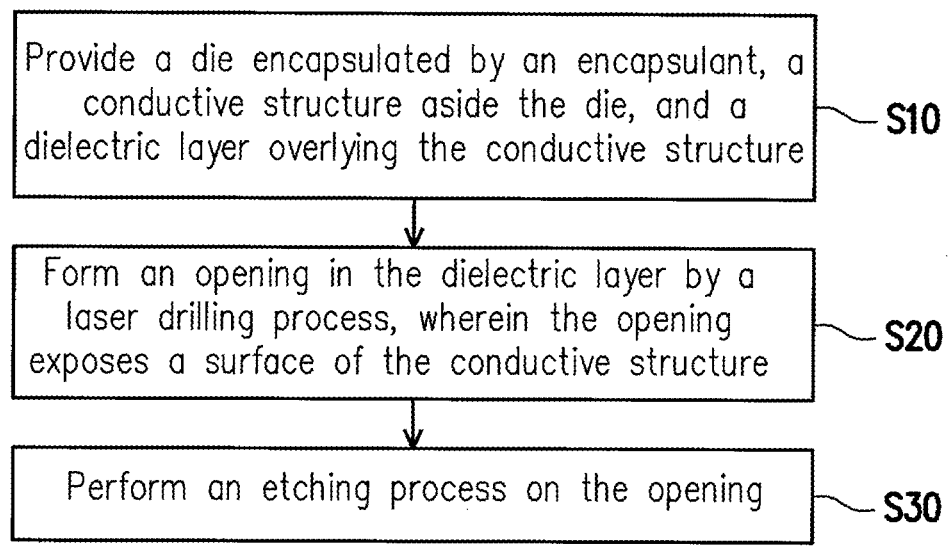
FIG. 1 is a flowchart showing a manufacturing method of a package structure in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a second feature over or on a first feature in the description that follows may include embodiments in which the second and first features are formed in direct contact, and may also include embodiments in which additional features may be formed between the second and first features, such that the second and first features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "top," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1 is a flowchart showing a manufacturing method of a package structure in accordance with some embodiments. FIG. 2A through FIG. 2F are schematic views showing a manufacturing method of a package structure in accordance with some embodiments. FIG. 3A and FIG. 3B are schematic top views respectively showing openings of FIG. 2C and FIG. 2D.

Figure 2A:
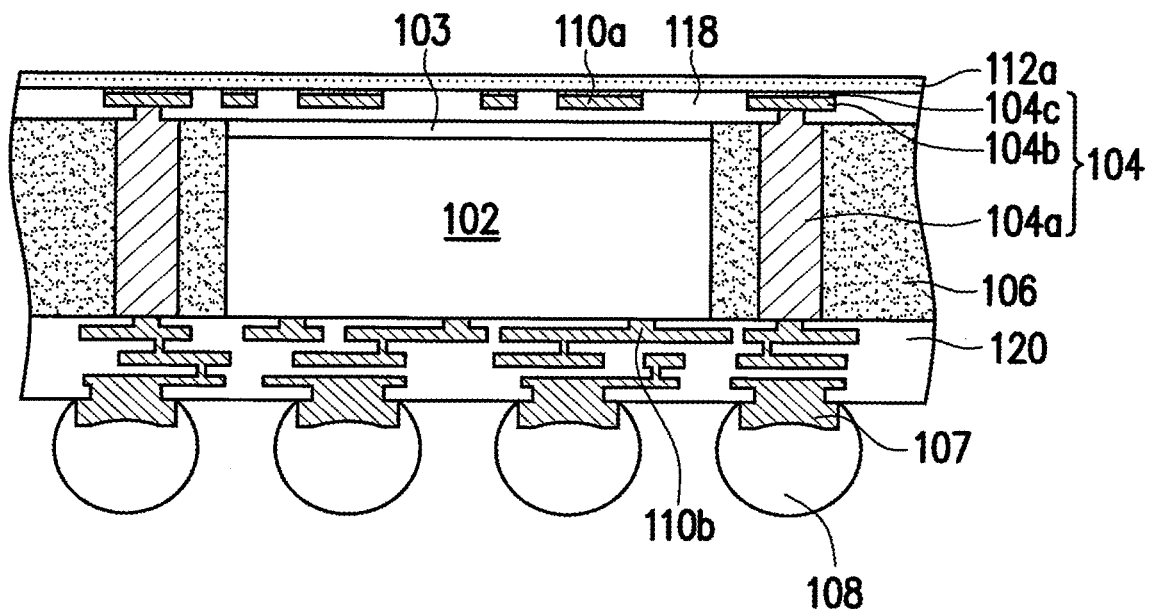
FIG. 2A through FIG. 2F are schematic views showing a manufacturing method of a package structure in accordance with some embodiments.
Figure 2B:
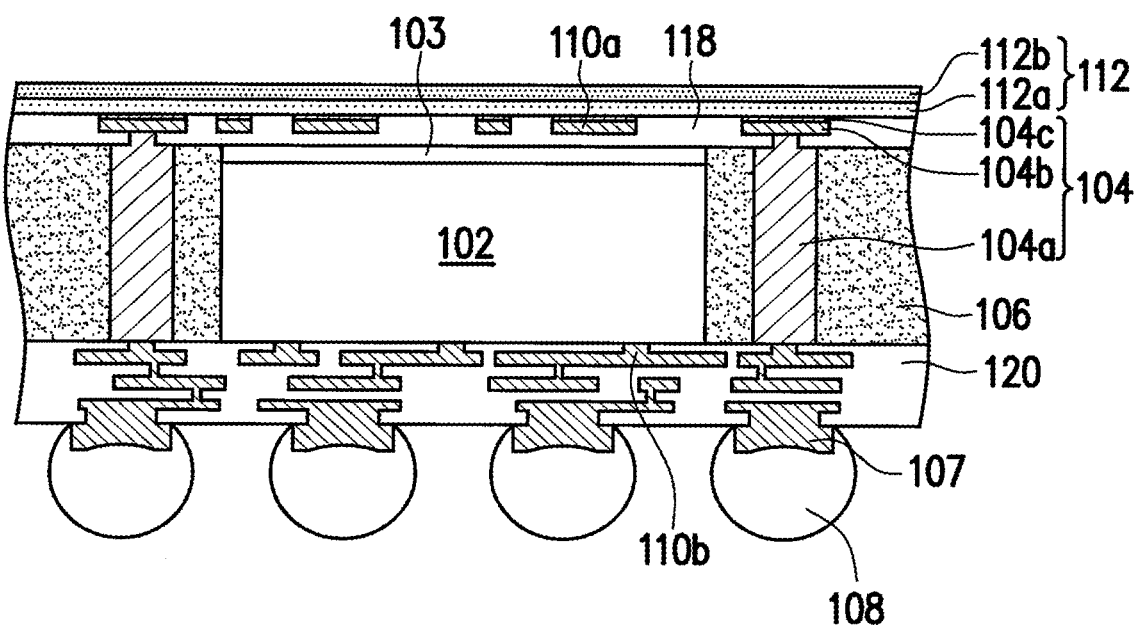

First, with reference to FIG. 1, FIG. 2A and FIG. 2B, in Step S10, a die 102, one or multiple conductive structures 104 and a dielectric layer 112 are provided. The die 102 is encapsulated by an encapsulant 106, the conductive structures 104 are formed aside the die 102, and the dielectric layer 112 is formed overlying the conductive structure 104. In some embodiments, the die 102 is surrounded by the conductive structures 104. In some embodiments, the die 102 may be any suitable integrated circuit chip for a particular application. For example, the die 102 may be a memory chip, such as a DRAM, SRAM, NVRAM, or a logic circuit. Although one die 102 is shown in FIGS. 2A to 2F, a plurality of dies may be encapsulated by the encapsulant 106. In some embodiments, the conductive structure 104 includes a through via 104a in the encapsulant 106, a redistribution line layer 104b overlying the through via 104a, and a seed layer 104c overlying the redistribution line layer 104b. Materials of the through via 104a and the redistribution line layer 104b include metals such as copper, nickel, solder or combinations thereof. In alternative embodiments, the conductive structure 104 includes barrier layers, such as Ti, TiN, Ta, TaN layers at sidewalls of the through via 104a. The seed layer 104c includes copper or titanium. The redistribution line layer 104b and the seed layer 104c are optional, and details thereof are described in the following embodiment. Redistribution line layers 110a and 110b are forming over both sides of the die 102 to allow, for example, a different pin configuration as well as a larger electrical connection. Similarly, the redistribution line layers 104b and 110b are formed over both sides (e.g. upper side and lower side) of the through via 104a. The redistribution line layers 104b, 110a and 110b are formed in dielectric layers 118 and 120 to be insulated from other components. In some embodiments, the through via 104a of the conductive structure 104 is further extended into the dielectric layer 118. In some embodiments, a plurality of under-bump metallization (UBM) layers 107 are formed overlying the top level of the redistribution line layers 110b, and a plurality of connectors 108 such as solder balls are formed over the surface of UBM layers 107. The conductive structures 104 provide electrical connections between the connectors 108 and the connectors (not shown in FIG. 2A) at opposite ends.

The encapsulant 106 encapsulates the die 102 to protect the die 102 from the environment and external contaminants. A material of the encapsulant 106 may include molding compound materials including resin and filler, a photo-sensitive material such as polybenzoxazole (PBO), polyimide, benzocyclobutene (BCB), any combination thereof and/or the like. In alternative embodiments, the encapsulant 106 may be formed of a nitride such as silicon nitride, an oxide such as silicon oxide, phosphosilicate glass (PSG), borosilicate glass (BSG), boron-doped phosphosilicate glass (BPSG), any combination thereof and/or the like.

In some embodiments, the dielectric layer 112 includes, for example, a dielectric layer 112a and a dielectric layer 112b. However, in alternative embodiments, the dielectric layer 112b may be omitted. In other words, the dielectric layer 112 in alternative embodiments has a single-layer structure such as the dielectric layer 112a shown in FIG. 2A. In some embodiments, the dielectric layer 112 covers the conductive structures 104, and the dielectric layer 112 is also formed above the die 102. That is, the dielectric layer 112 simultaneously covers the tops of the seed layers 104c of the conductive structures 104 and the top of the redistribution line layer 110a above the die 102.

In some embodiments, the dielectric layer 112a is formed over a carrier (not shown), the dielectric layer 118 is formed over the dielectric layer 112a, and then the seed layer 104c and the redistribution line layer 104b are sequentially formed in the dielectric layer 118 while the redistribution line layers 110a are formed in the dielectric layer 118. Then, the through vias 104a are formed above the redistribution layer 104b by lithography, plating and etching process. Thereafter, the die 102 is placed on the carrier through a die attach film (DAF) 103 and the encapsulant 106 is formed over the carrier to encapsulate the die 102. In some embodiments, the through vias 104a are then formed through the encapsulant 106 by laser opening and plating process. After forming the redistribution line layer 110b, the UBM layer 107 and the connectors 108 over the carrier, the package is turned over and debonded from the carrier. The dielectric layer 112a is formed of a photo-sensitive material such as polybenzoxazole (PBO), polyimide, benzocyclobutene (BCB), any combination thereof and/or the like, which may be easily patterned using a lithography mask. In alternative embodiments, the dielectric layer 112a is formed of a nitride such as silicon nitride, an oxide such as silicon oxide, phosphosilicate glass (PSG), borosilicate glass (BSG), boron-doped phosphosilicate glass (BPSG), any combination thereof and/or the like. The dielectric layer 112a is formed by suitable fabrication techniques such as spin coating, lamination, deposition and/or the like. A thickness of the dielectric layer 112a is, for example, in a range of 5-15 um.

In some embodiments, as shown in FIG. 2B, the dielectric layer 112b is optionally formed over the dielectric layer 112a. In some embodiments, the dielectric layer 112b is used for the purpose of a laser mark or warpage suppression and includes a polymer-based material. The dielectric layer 112b is formed by suitable fabrication techniques such as spin coating, lamination, deposition and/or the like. A thickness of the dielectric layer 112b is, for example, in a range of 20-40 um.

Figure 2C:
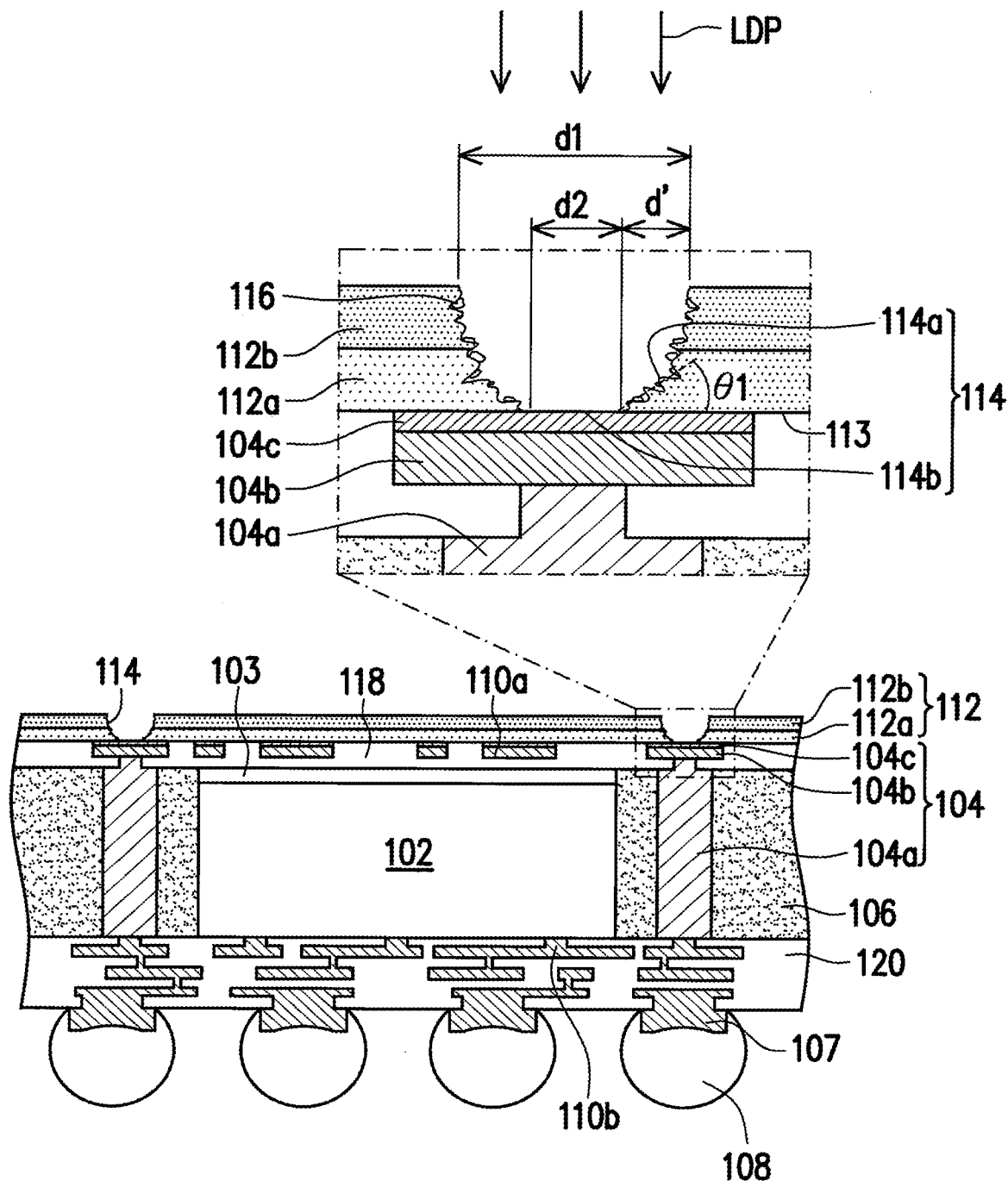
Figure 3A:
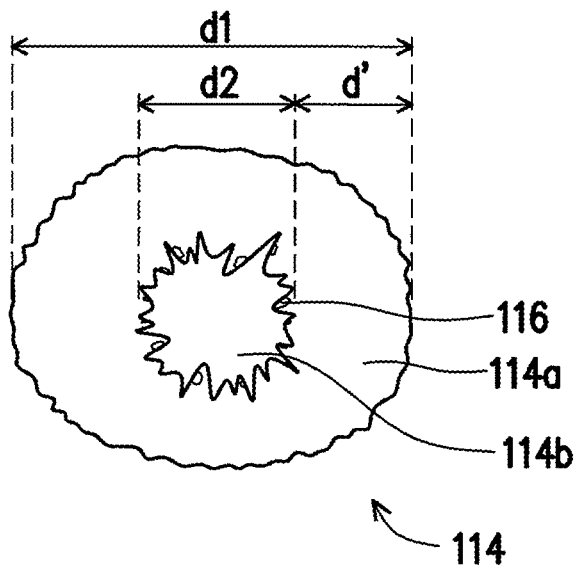
FIG. 3A and FIG. 3B are schematic top views respectively showing openings of FIG. 2C and FIG. 2D.
Figure 3B:
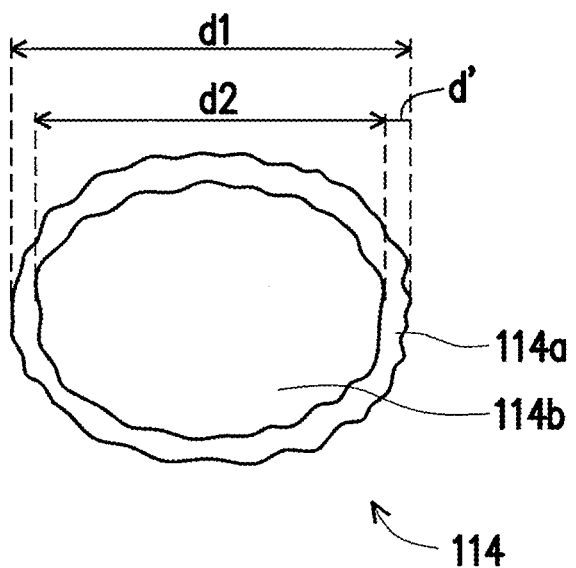

Then, with reference to FIG. 1 and FIG. 2C, in Step S20, one or multiple openings 114 are formed in the dielectric layer 112 by a laser drilling process LDP. The openings 114 respectively expose surfaces of the conductive structures 104. In some embodiments, the opening 114 exposes, for example, the seed layer 104c of the conductive structure 104. In some embodiments, the laser drilling process LDP removes a thickness of the dielectric layer 112 larger than 5 um. The opening 114 formed by the laser drilling process LDP has, for example, a bowl shape. In other words, a bottom area of the opening 114 is smaller than a top area of the opening 114. Specifically, a first included angle $\theta 1$ is formed between a bottom surface 113 of the dielectric layer 112 and a sidewall 114a of the opening 114. In some embodiments, the first included angle $\theta 1$ is an included angle formed between the bottom surface 113 of the dielectric layer 112a and the sidewall 114a of the opening 114 in the dielectric layer 112a. The first included angle $\theta 1$ may be from 15 to 50 degrees. For example, the first included angle $\theta 1$ can be, but not limited to, about 15, 20, 25, 30, 35, 40, 45, 50 degrees including any range between any two of the preceding values and any range more than any one of the preceding values. A diameter d2 of the bottom 114b of the opening 114 is smaller than the diameter d1 of the top of the opening 114. For example, the diameter d1 of the top of the opening 114 is 80-100 um, the diameter d2 of the bottom 114b of the opening 114 is 70-90 um, and a distance d' by which the sidewall 114a of the opening 114 extends from the inner side to the outer side is 10 um. That is, there is a significant difference between the diameter d1 of the top of the opening 114 and the diameter d2 of the bottom 114b of the opening 114. In addition, a plurality of pores and residues 116 are formed on the sidewall 114a of the opening 114 by the laser drilling process LDP. Therefore, the sidewall 114a of the opening 114 is not smooth and has a first roughness Ra1. A top view of the opening 114 has a non-uniform and non-smooth edge, as shown in FIG. 3A, and there are a plurality of pores and residues 116 on the sidewall 114a. That is, the opening 114 has a poor sidewall shape.

Figure 2D:
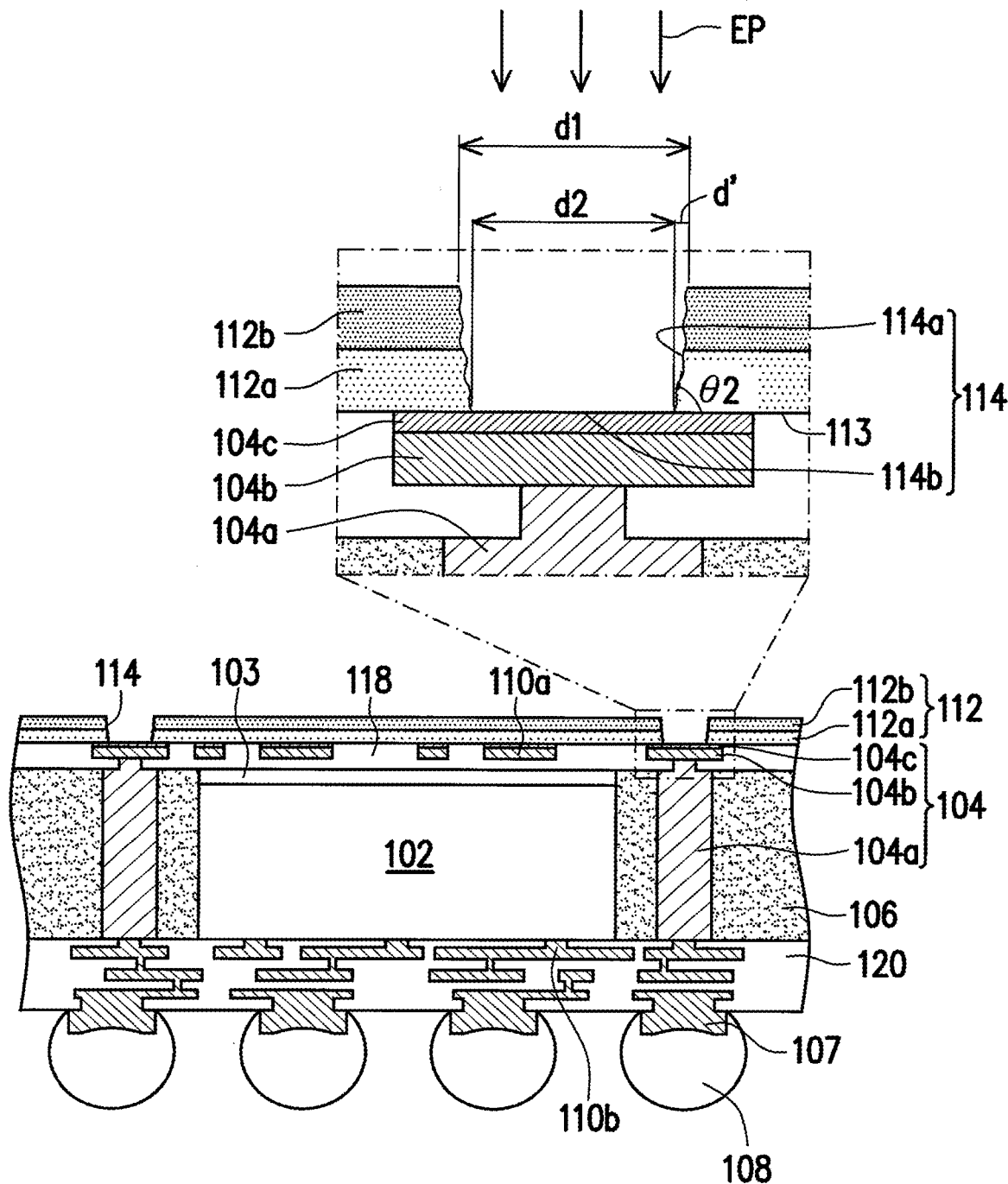

Thereafter, with reference to FIG. 1 and FIG. 2D, in Step S30, an etching process EP is performed on the openings 114. Accordingly, the exposed surfaces of the conductive structures 104 are increased. In some embodiments, the etching process EP includes a dry etching process or a wet etching process. The dry etching process is a plasma etching process, which uses a mixture gas including at least one of an oxide-based gas such as O2, Ar, N2, CF4, and NH3. The wet etching process is a rinse process. The etching process EP is mainly for etching the sidewall 114a of the opening 114. The etching process EP laterally etches the sidewall 114a of the opening 114, so as to expand the opening 114 outward. Specifically, after performing the etching process EP, a second included angle $\theta 2$ is formed between the bottom surface 113 of the dielectric layer 112 and the sidewall 114a of the opening 114, and the sidewall 114a of the opening 114 becomes steeper. In some embodiments, the second included angle $\theta 2$ is an included angle formed between the bottom surface 113 of the dielectric layer 112a and the sidewall 114a of the opening 114 in the dielectric layer 112a. The second included angle $\theta 2$ is larger than the first included angle $\theta 1$, and the second included angle $\theta 2$ is larger than about 60 degrees. The second included angle $\theta 2$ may be from 65 to 90 degrees. In some embodiments, the second included angle $\theta 2$ of the sidewall 114a can be, for example but not limited to, about 65, 70, 75, 80, 85, 90 degrees, including any range between any two of the preceding values and any range more than any one of the preceding values.

The diameter d2 of the bottom 114b and the diameter d1 of the top of the opening 114 are substantially close to each other. Therefore, compared with the opening 114 formed by the laser drilling process LDP in FIG. 2C, the opening 114 in FIG. 2D exposes a larger area of the conductive structure 104. For example, the diameter d1 of the top and the diameter d2 of the bottom 114b of the opening 114 are respectively in a range of 80-100 um, and the distance d' by which the sidewall 114a of the opening 114 extends from the inner side to the outer side is reduced to be smaller than 2 um. Moreover, the etching process EP removes the dielectric residues 116 formed in the opening 114 by the laser drilling process LDP and etches the sidewall 114a of the opening 114, so as to significantly reduce the number of the pores and residues on the sidewall 114a of the opening 114, such that the sidewall 114a of the opening 114 has the second roughness Ra2 that is smaller than the first roughness Ra1. In some embodiments, the opening 114 has a scallop sidewall 114a. Further, the top view of the opening 114 has a larger critical dimension and a smooth edge without sidewall distortion, as shown in FIG. 3B. It is noted that, compared with openings formed by the lithography or other processes, since the opening 114 is first formed by the laser drilling process LDP, the opening 114 has an edge profile derived from the laser drilling process LDP, and is a slightly non-smooth and non-repeatable edge.

Figure 2E:
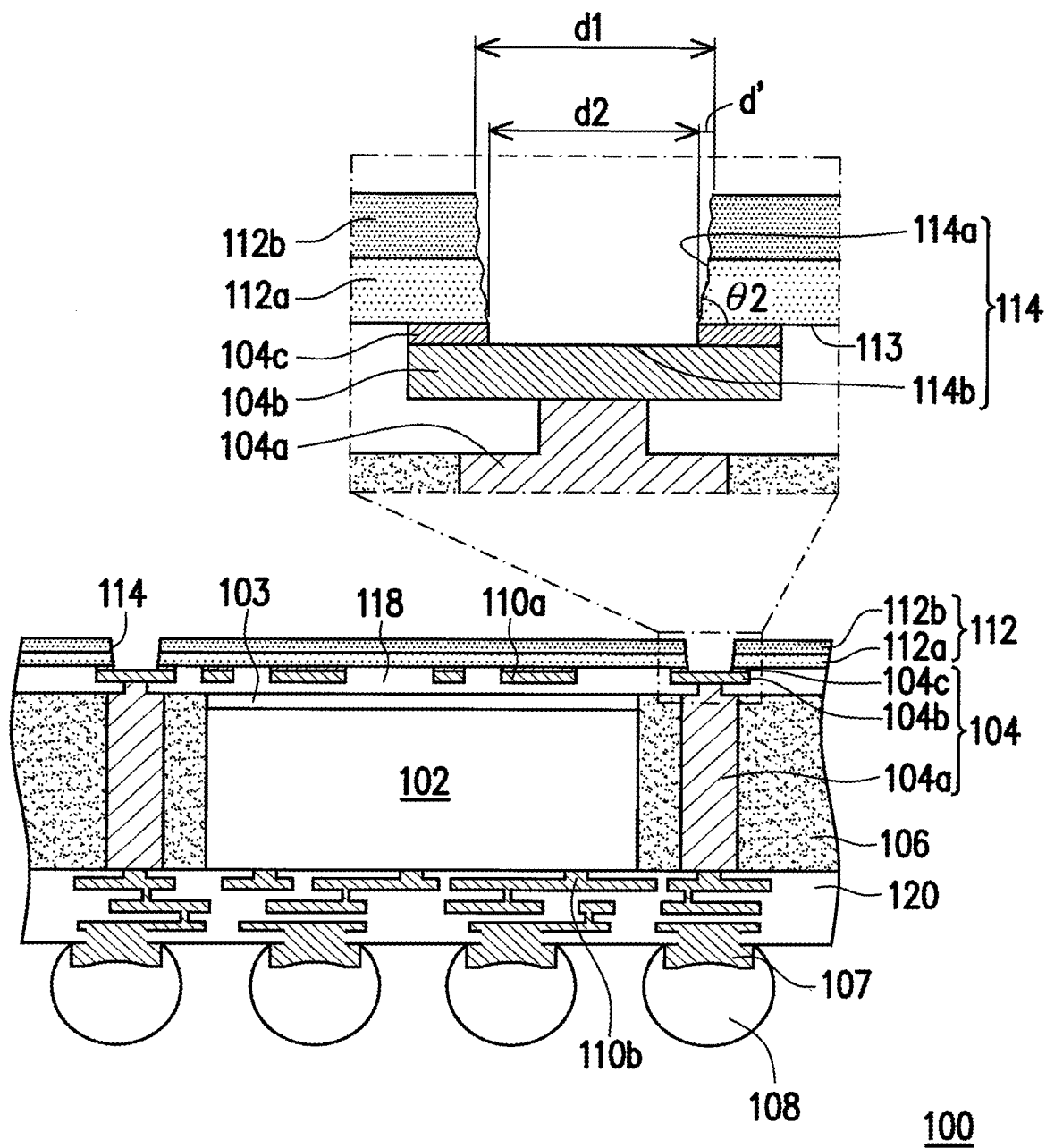

Next, with reference to FIG. 2E, in some embodiments, after performing the etching process EP, the seed layer 104c exposed by the opening 114 is further removed. Accordingly, the top surface of the redistribution line layer 104b is exposed by the opening 114 and does not have the seed layer 104c thereon, and therefore, the seed layer 104c is located on a portion of the redistribution line layer 104b. A method of removing the seed layer 104c is a dry etching process such as a plasma etching process.

As illustrated in FIG. 2E, a package structure 100, which may be called a bottom package structure, includes the die 102 encapsulated by the encapsulant 106, the conductive structures 104 aside the die 102, and the dielectric layer 112 having the openings 114 therein. The opening 114 has a proper critical dimension and thus exposes a larger area of the top of the conductive structure 104. The sidewall 114a of the opening 114 is a scallop sidewall. The included angle θ2 formed between the bottom surface 113 of the dielectric layer 112 and the sidewall 114a of the opening 114 is larger than about, for example, 60 degrees.

Figure 2F:
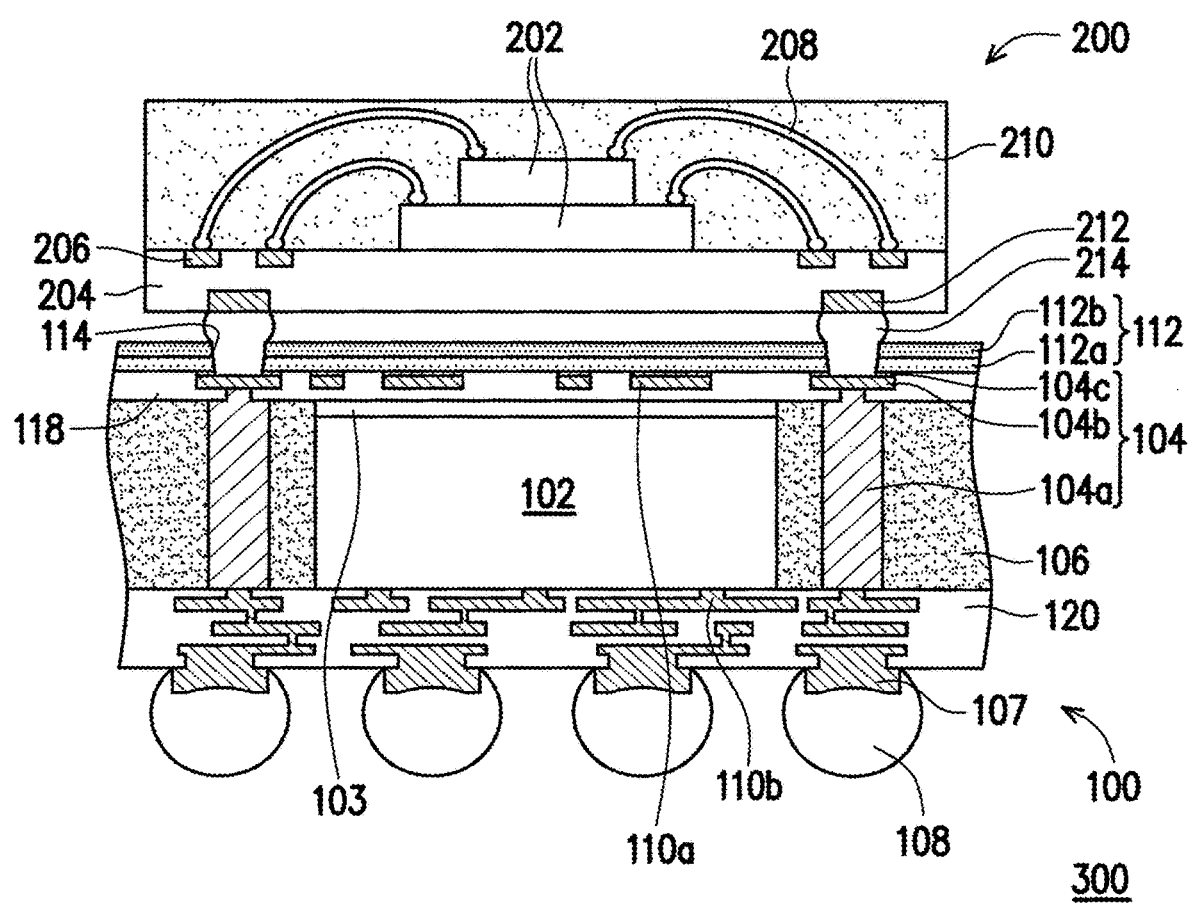

Next, with reference to FIG. 2F, in some embodiments, the package structure 100 is further electrically coupled to another package structure 200 through the openings 114. In this step, the package structure 200 is aligned so that the connectors 214 of the top package structure 200 are placed on tops of the conductive structures 104 of the bottom package structure 100. Afterwards, the formed package structure is reflowed to form a connection between the conductive structures 104 of the bottom package structure 100 and the connectors 214 of the top package structure 200. In some embodiments, the reflow process is performed using an induction reflow process. In alternative embodiments, however, other reflow processes may also be used. The result is a PoP device 300 as shown in FIG. 2F.

As illustrated in FIG. 2F, another package structure 200, which may be a top package structure, has a substrate 204. A die 202 is mounted on one surface of the substrate 204, which may be the top surface of the substrate 204. In some embodiments, the die 202 is any suitable integrated circuit chip for a particular application. Bond wires 208 are used to provide electrical connections between the die 202 and a set of conductive connectors 206 such as bond pads on the same surface of the substrate 204, which may be the top surface of the substrate 204. Through vias (not shown) may be used to provide electrical connections between the conductive connectors 206 and another set of conductive connectors 212 such as bond pads on an opposing surface of the substrate 204, which may also be the bottom surface of the substrate 204. An encapsulant 210 is formed over the components to protect the components from the environment and external contaminants. A plurality of connectors such as solder balls 214 are formed on the bottom surface of the substrate 204. The connectors 214 are used to connect to another package structure, such as a bottom package structure 100. The connectors 214 are attached to the connectors 212, which may be bond pads, on the bottom of the substrate 204.

The package structure 100 and the package structure 200 are electrically coupled to form a package-on-package (PoP) device 300 as shown in FIG. 2F. A set of connectors such as 214 are disposed on the top surface of the package structure 100. The connectors 214, which may be called as PoP connectors, are disposed according to the site of conductive structures 104 of the bottom package structure 100.

Furthermore, other normal processes may be used to complete the device. For example, the package structure is attached to yet another substrate, such as a printed circuit board (PCB), a high-density interconnect, a silicon substrate, an organic substrate, a ceramic substrate, a dielectric substrate, a laminate substrate, another semiconductor package structure, or the like.

In the above embodiments, the opening 114 is first formed by performing the laser drilling process LDP, and then the sidewall 114a of the opening 114 is treated by the etching process EP. The etching process EP removes residues 116 on the sidewall 114a, caused in the laser drilling process LDP, and laterally etches the sidewall 114a of the opening 114, so as to expand the opening 114 outward and increase the included angle θ2 between the bottom surface 113 of the dielectric layer 112 and the sidewall 114a of the opening 114. Since the included angle θ2 is increased to larger than about 60 degrees, the diameter d2 of the bottom 114b and the diameter d1 of the top of the opening 114 becomes close to each other. Therefore, the formed opening 114 has a smoother edge and a larger critical dimension, e.g. 80-100 um, without sidewall distortion. Accordingly, the etching process EP improves the problem of distortion of the opening, which results from the increase of the critical dimension of the opening when the laser drilling process LDP is used to form the opening. Since the formed openings 114 have a desired critical dimension and a good profile, the conductive structures 104 of the package structure 100 can be properly exposed. Therefore, when joining the package structure 100 with a device such as the package structure 200, the connectors 214 of the package structure 200 may be filled properly in the openings 114 having a larger size and a good profile, and the conductive structures 104 of the package structure 100 are in good contact with the connectors 214 of the package structure 200. As a result, the electrical connection between the two package structures 100 and 200 is favorable and reliable, and the device 300 formed by stacking the two package structures 100 and 200 has favorable electrical connection and better reliability.

Figure 4A:
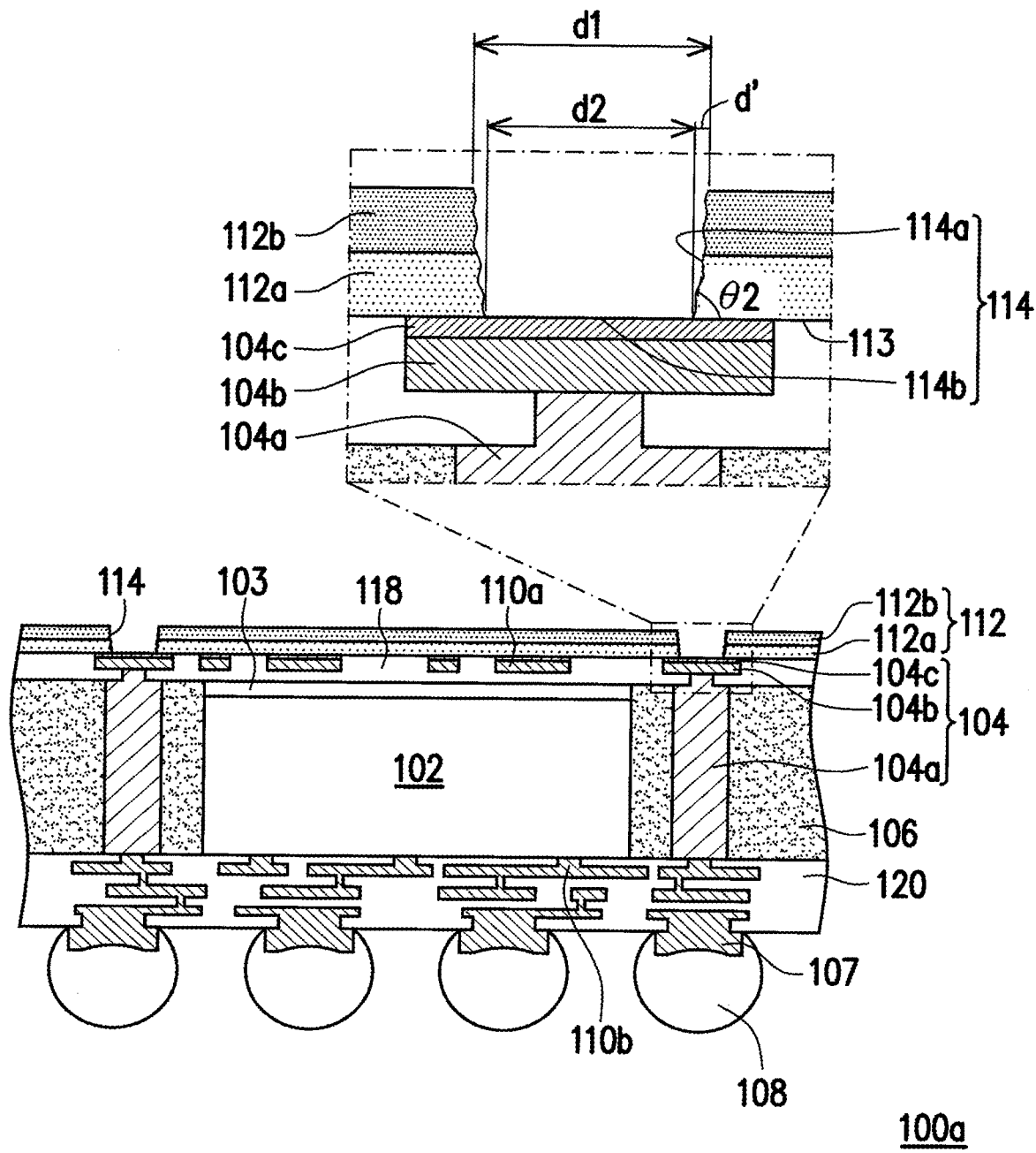
FIG. 4A and FIG. 4B are schematic views showing a package structure in accordance with some embodiments.
Figure 4B:
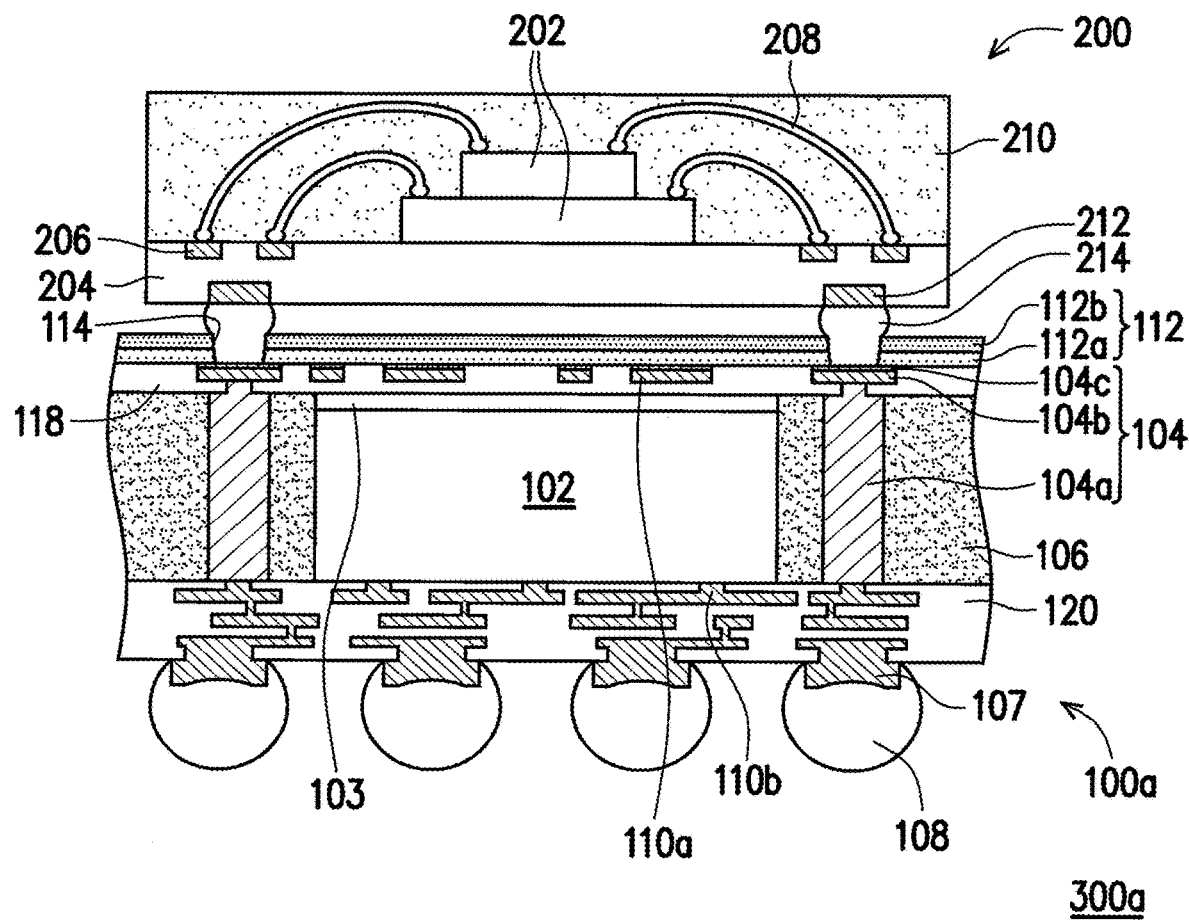

The above embodiments illustrate an example where the seed layer 104c exposed by the opening 114 is removed. However, the disclosure is not limited thereto. In some embodiments, as shown in FIG. 4A, the seed layer 104c is retained. That is, in a package structure 100a formed in some embodiments, the opening 114 exposes the seed layer 104c of the conductive structure 104. Therefore, as shown in FIG. 4B, when forming a PoP device 300a by joining the package structure 100a and the package structure 200, the connectors 214 of the package structure 200 are bonded to the conductive structures 104 through the seed layer 104c.

Figure 5A:
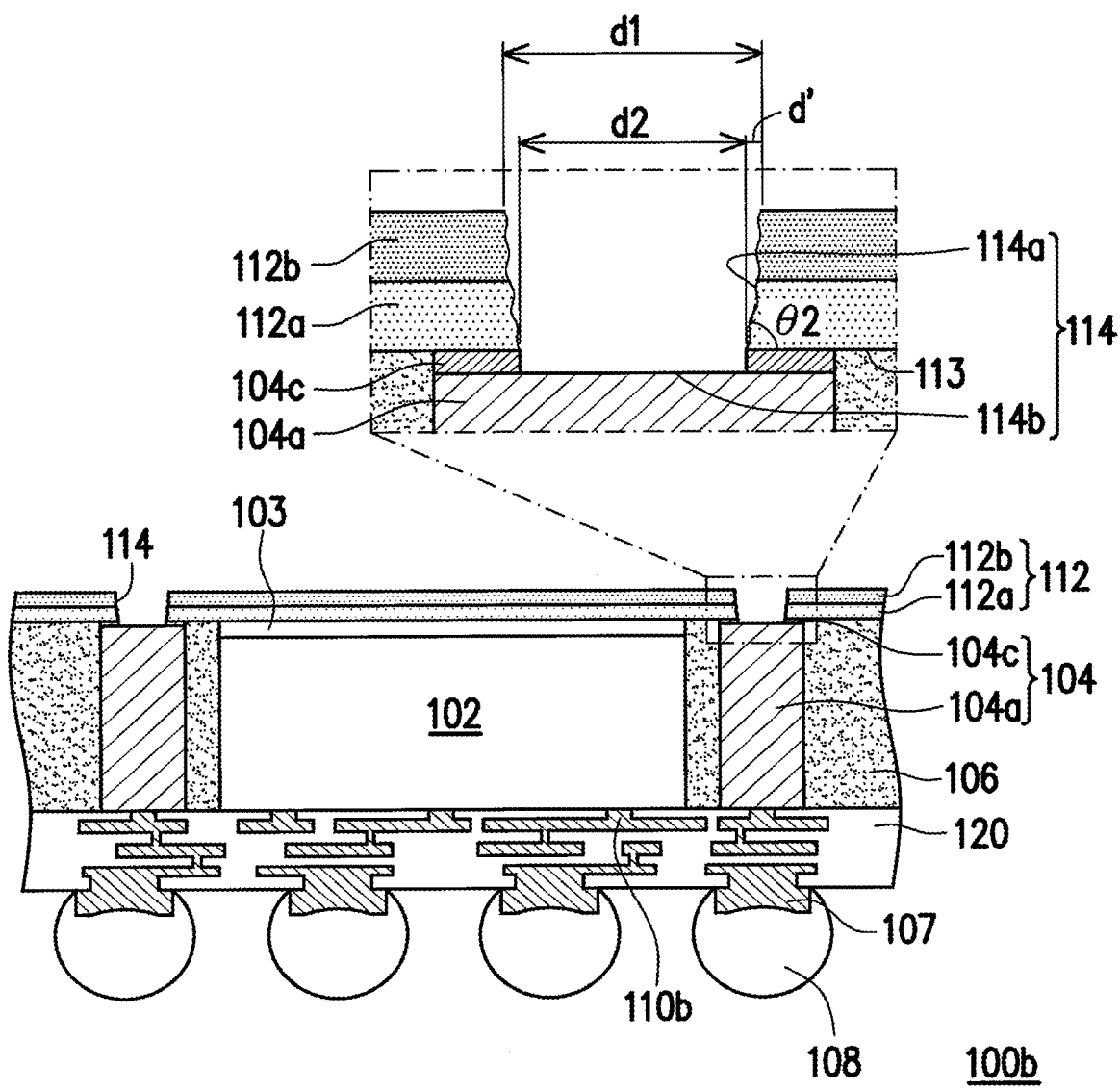
FIG. 5A and FIG. 5B are schematic views showing a package structure in accordance with some embodiments.
Figure 5B:
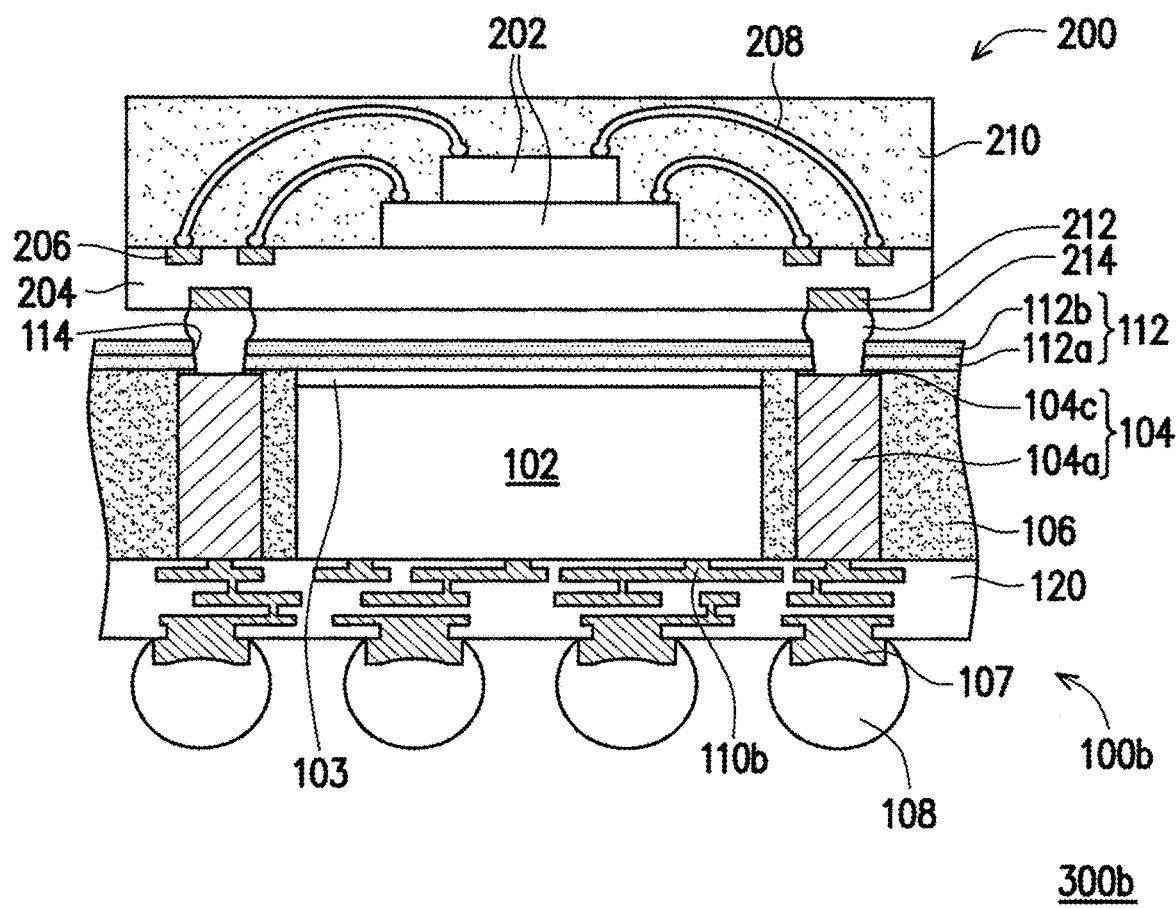

In some embodiments, as shown in FIG. 5A, the top of the conductive structure 104 does not include the redistribution line layer 104b shown in FIG. 2A. That is, in a package structure 100b formed in some embodiments, the conductive structure 104 includes the through via 104a and the seed layer 104c overlying the through via 104a. Similarly, there is no redistribution line layer above the die 102. Moreover, the seed layer 104c exposed by the opening 114 is removed after performing the etching process EP on the opening 114. Thus, the opening 114 in the package structure 100b exposes the through via 104a. Accordingly, as shown in FIG. 5B, when forming a PoP device 300b by joining the package structure 100b and the package structure 200, the connectors 214 of the package structure 200 are in direct contact with the through vias 104a. In other words, the package structure 200 directly joints on the through vias 104a of the package structure 100b. In alternative embodiments (not shown), the conductive structure 104 may include the through via 104a, and does not include the seed layer 104c as shown in FIG. 5A and FIG. 5B.

Figure 6A:
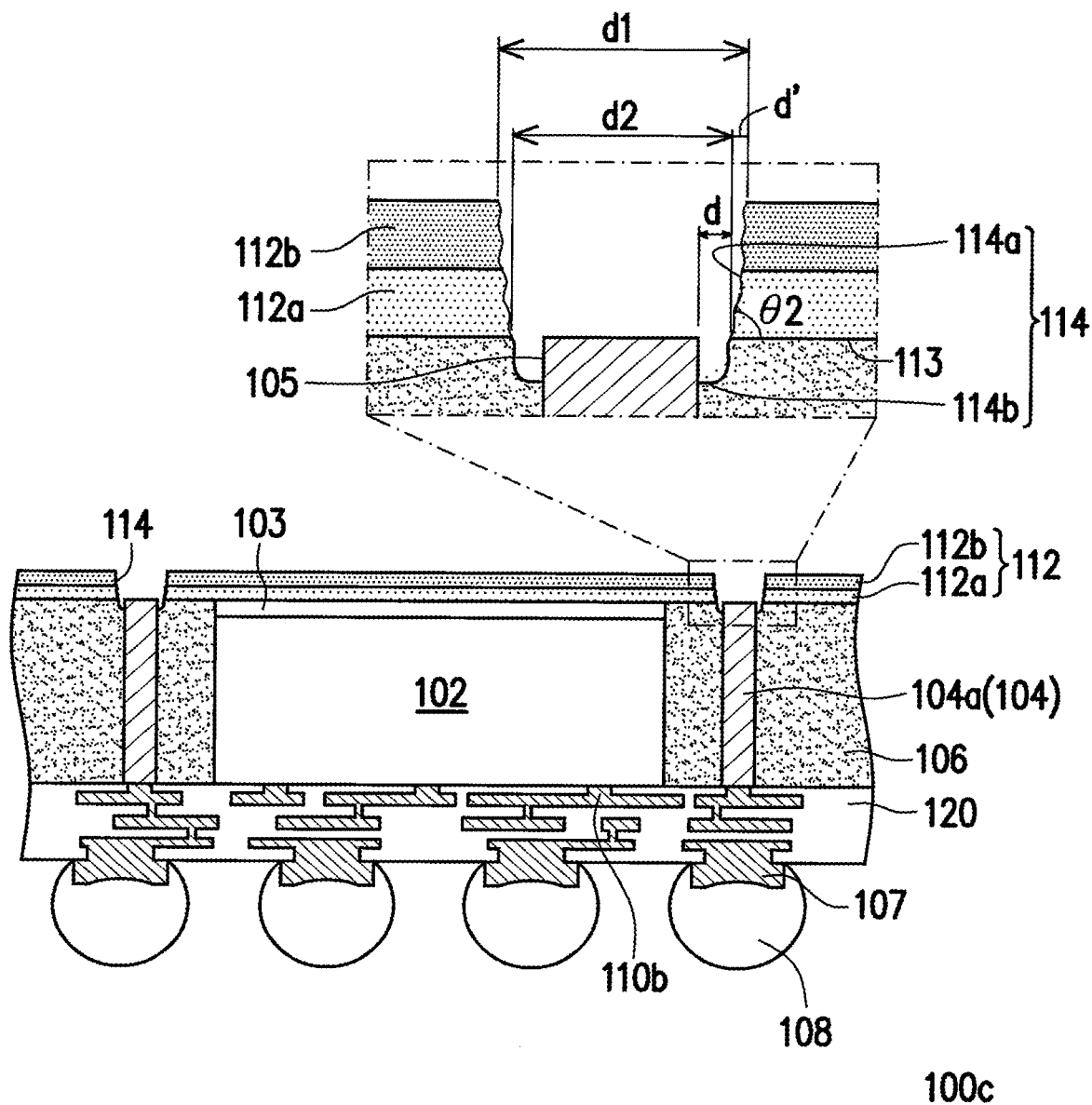
FIG. 6A and FIG. 6B are schematic views showing a package structure in accordance with some embodiments.
Figure 6B:
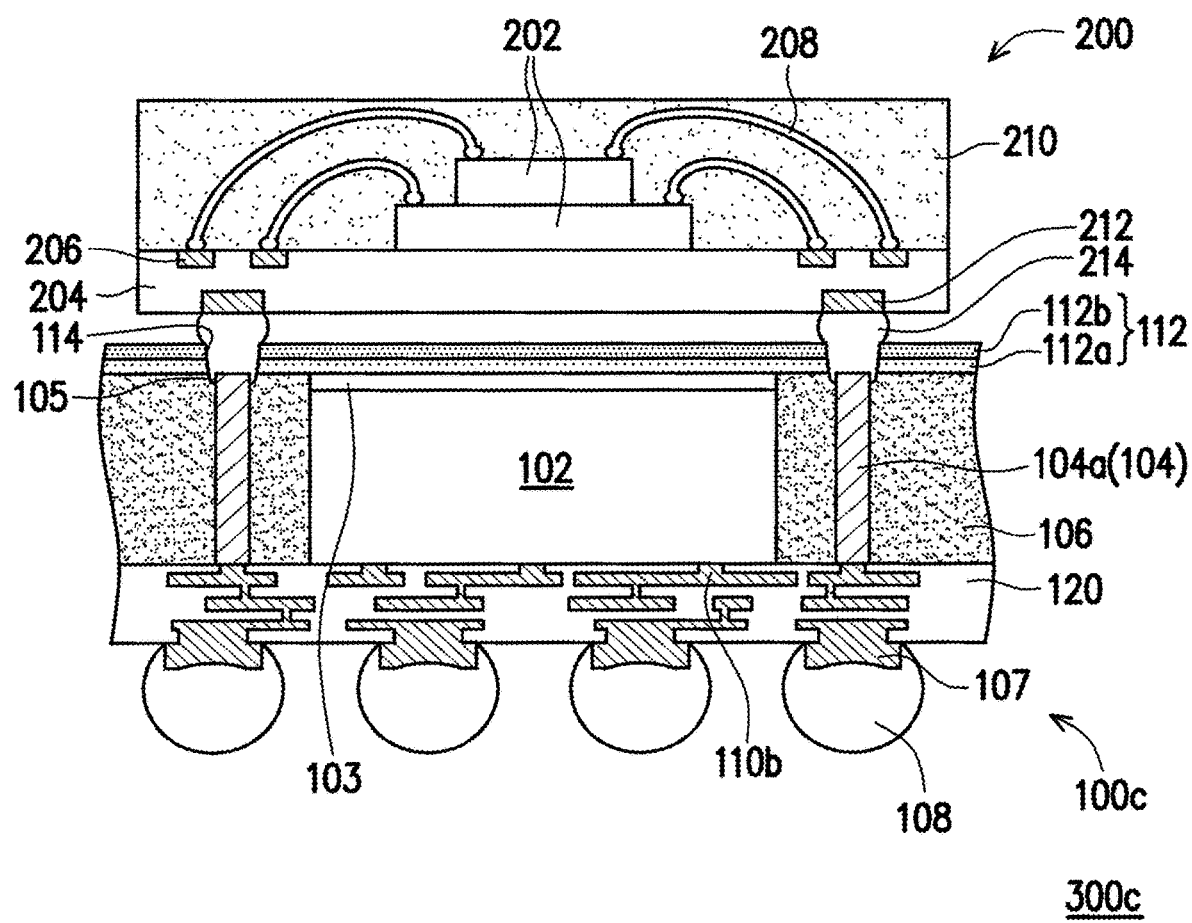
Figure 7A:
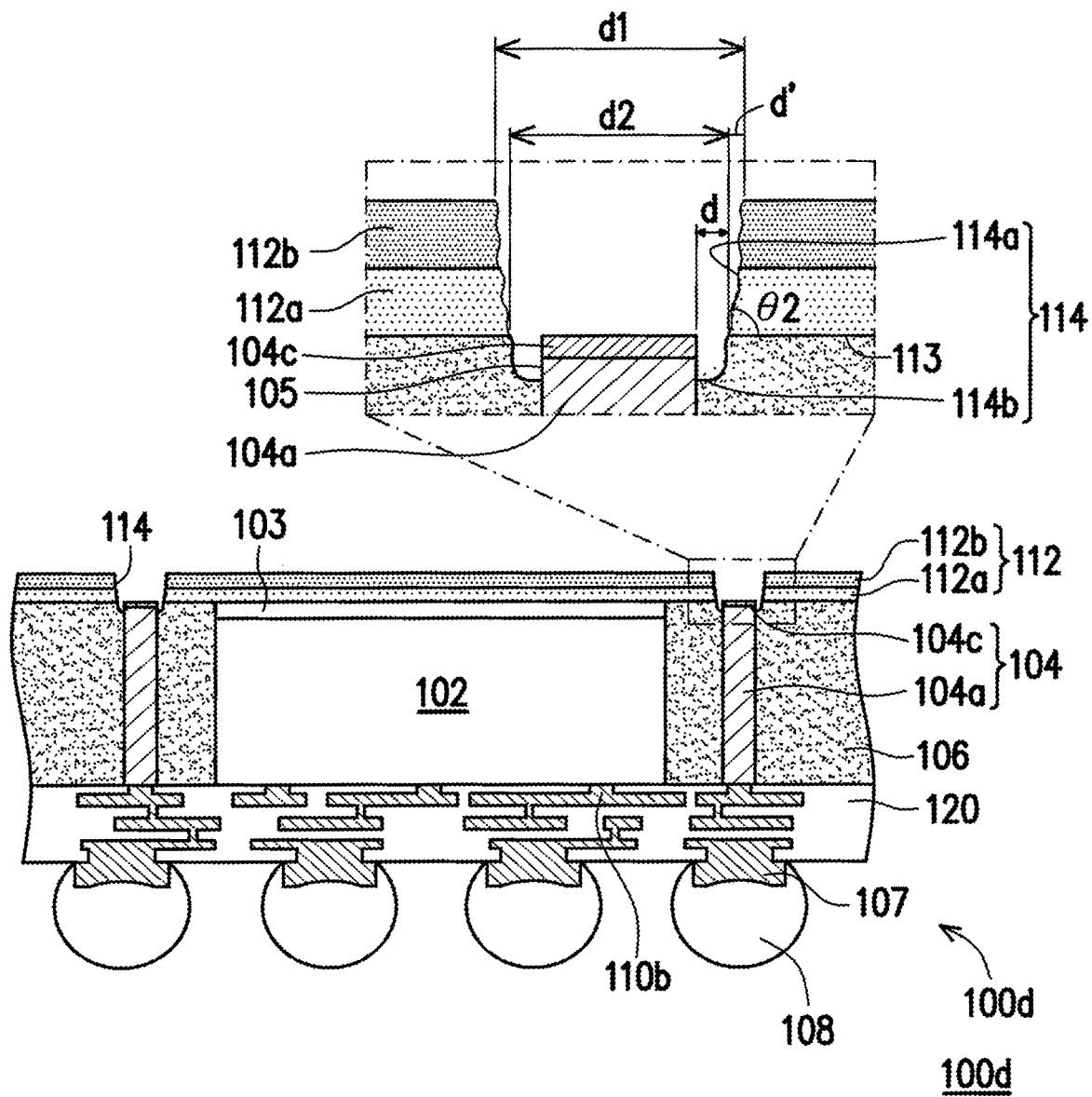
FIG. 7A and FIG. 7B are schematic views showing a package structure in accordance with some embodiments.
Figure 7B:
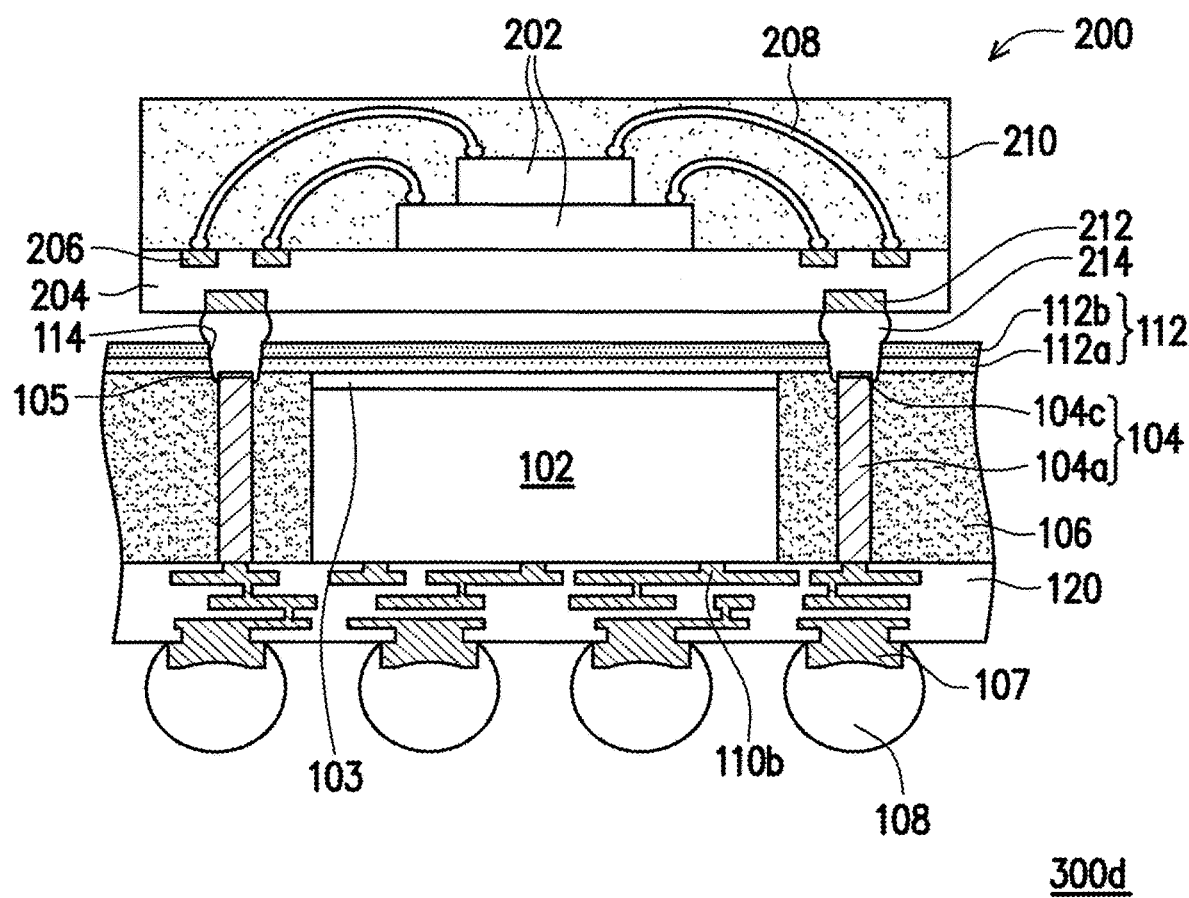

The above embodiments illustrate examples where the opening 114 exposes a partial top surface of the conductive structure 104, that is, the bottom area of the opening 114 is substantially smaller than the top area of the conductive structure 104. However, it should be noted that the disclosure is not limited thereto. In some embodiments, as shown in FIG. 6A, in the process of forming the openings 114, at least one of the laser drilling process LDP and the etching process EP removes the encapsulant 106 around the top of the conductive structure 104, so as to expose an upper sidewall 105 of the conductive structure 104. In other words, in a package structure 100c formed in some embodiments, the size of the opening 114 is larger than a top size of the conductive structure 104, wherein a distance d between the edge of the conductive structure 104 and the sidewall 114a of the opening 114 is in a range of 5-20 um. In some embodiments, the conductive structure 104 includes, for example, the through via 104a. Thus, the upper sidewall 105 and the entire top surface of the through via 104a are exposed. Accordingly, as shown in FIG. 6B, when forming a PoP device 300c by joining the package structure 100c and the package structure 200, the connectors 214 of the package structure 200 are in direct contact with the through vias 104a of the package structure 100c. For example, the connectors 214 are in direct contact with the top surfaces and the upper sidewalls 105 of the through vias 104a. In other words, the package structure 200 directly joints on the through vias 104a. In some embodiments, as shown in FIG. 7A, in a package structure 100d, the through via 104a further has the seed layer 104c thereon, such that the opening 114 exposes the seed layer 104c and the upper sidewall 105 of the through via 104a. Therefore, as shown in FIG. 7B, when forming a PoP device 300d by joining the package structure 100d and the package structure 200, the connectors 214 of the package structure 200 are in contact with the through vias 104a through the seed layers 104c. That is, the connectors 214 are in contact with the top surface of the seed layers 104c and the upper sidewalls 105 of the through vias 104a of the package structure 100d.

In the above embodiments, the openings are formed in the dielectric layer by sequentially performing the laser drilling process and the etching process, such that the sidewall of the opening has a small roughness, and an included angle between the bottom surface of the dielectric layer and the sidewall of the opening is larger than about 60 degrees. Accordingly, the opening has a larger critical dimension, e.g. 80-100 um, and a smooth edge without sidewall distortion. Hence, the etching process improves the problem of distortion of the opening, which results from the increase of the critical dimension of the opening when the laser drilling process is used to form the opening. Since the formed opening has a desired critical dimension and a good profile, the conductive structures of the package structure that are exposed by the openings are in good contact with the connectors of another device such as a package structure. As a result, the electrical connection between the package and another device is favorable and reliable, and the device formed by stacking the package and another device has favorable electrical connection and better reliability. Furthermore, using the laser drilling process and the etching process to the packaging process to form the openings would not significantly change the manufacturing steps or greatly increase the production costs, and throughput for the openings having a larger critical dimension is significantly improved.

A device includes a die encapsulated by an encapsulant, a conductive structure aside the die, and a dielectric layer overlying the conductive structure. The conductive structure includes a through via in the encapsulant, a redistribution line layer overlying the through via, and a seed layer overlying the redistribution line layer. The dielectric layer includes an opening, wherein the opening exposes a surface of the conductive structure, the opening has a scallop sidewall, and an included angle between a bottom surface of the dielectric layer and a sidewall of the opening is larger than about 60 degrees.

A package structure includes a die encapsulated by an encapsulant, a conductive structure aside the die, and a dielectric layer overlying the conductive structure. The conductive structure includes a through via in the encapsulant. The dielectric layer includes an opening, wherein the opening exposes a surface of the conductive structure, the opening has a scallop sidewall, and an included angle between a bottom surface of the dielectric layer and a sidewall of the opening is larger than about 60 degrees.

A manufacturing method of a package structure includes the following. A die encapsulated by an encapsulant, a conductive structure aside the die, and a dielectric layer overlying the conductive structure are provided. An opening is formed in the dielectric layer by a laser drilling process, wherein the opening exposes a surface of the conductive structure. An etching process is performed on the opening.

Although embodiments of the disclosure and their advantages have been described in detail above, it should be understood that various changes, substitutions and alterations can be made herein without departing from the spirit and scope of the disclosure as defined by the appended claims. For example, it will be readily understood by those skilled in the art that many of the features, functions, processes, and materials described herein may be varied while remaining within the scope of the disclosure. Moreover, the scope of the disclosure is not intended to be limited to the particular embodiments of the process, machine, manufacture, composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A package structure, comprising:
a die, encapsulated by an encapsulant;
a conductive structure disposed aside the die, wherein the conductive structure comprises a through via in the encapsulant;
a dielectric layer overlying the die and the conductive structure; and
a conductive connector, connected with the conductive structure and inlaid in the dielectric layer, wherein the conductive connector protrudes from the dielectric layer and penetrates through the dielectric layer to connect with the underlying conductive structure, an included angle between a bottom surface of the dielectric layer and an interface between the conductive connector and the dielectric layer is larger than about 60 degrees, and wherein the conductive connector extends into the encapsulant and physically contacts the through via.

2. The package structure according to claim 1, wherein the conductive structure further comprises a seed layer overlying the through via, and the conductive connector physically contacts the seed layer.

3. The package structure according to claim 1, further comprising another package structure connected to the conductive connector.

4. The package structure according to claim 1, wherein the included angle ranges from about 65 degrees to about 90 degrees.

5. The package structure according to claim 1, wherein the conductive connector physically contacts an upper sidewall and a top surface of the through via.

6. The package structure according to claim 1, wherein the conductive structure further comprises a seed layer overlying the through via, and the conductive connector physically contacts the seed layer and an upper sidewall of the through via.

7. The package structure according to claim 1, further comprising a redistribution structure connected with the through via, wherein the redistribution structure and the conductive connector are located at two opposite sides of the through via.

8. The package structure according to claim 7, further comprising connector terminals connected to the redistribution structure.

9. The package structure according to claim 1, further comprising a die attach film disposed between a backside of the die and the dielectric layer.

10. A device, comprising:
a die, encapsulated by an encapsulant;
a conductive structure aside the die, wherein the conductive structure comprises a through via in the encapsulant, a redistribution line layer overlying the through via, and a seed layer overlying the redistribution line layer;
a dielectric layer overlying the die and the encapsulant; and
a conductive connector, disposed on and connected with the conductive structure and penetrating through the dielectric layer, wherein the conductive connector has a scallop sidewall, and the conductive connector extends into the encapsulant and physically contacts the seed layer.

11. The device according to claim 10, wherein the conductive connector penetrating through the seed layer reaching the redistribution line layer and the conductive connector physically contact the redistribution line layer and the seed layer.

12. The device according to claim 10, further comprising a redistribution structure connected with the through via, wherein the redistribution structure and the conductive connector are located at two opposite sides of the through via.

13. The device according to claim 12, wherein the redistribution structure comprises under-bump metallization (UBM) layers and connectors located on the UBM layers.

14. The device according to claim 10, further comprising a package structure disposed on and electrically connected to the conductive connector.

15. A device, comprising:
a die, encapsulated by an encapsulant;
a conductive structure aside the die, wherein the conductive structure comprises a through via in the encapsulant and a seed layer on the through via;
a dielectric layer overlying the die and the encapsulant; and
a conductive connector, disposed on and connected with the conductive structure and penetrating through the dielectric layer, wherein the conductive connector has a scallop sidewall, and the conductive connector extends into the encapsulant and physically contacts the seed layer and the though via.

16. The device according to claim 15, further comprising a die attach film disposed between a backside of the die and the dielectric layer.

17. The device according to claim 15, wherein the conductive connector wraps around the seed layer and an upper sidewall of the through via.

18. The device according to claim 15, further comprising a redistribution structure connected with the through via, wherein the redistribution structure and the conductive connector are located at two opposite sides of the through via.

19. The device according to claim 18, wherein the redistribution structure comprises under-bump metallization (UBM) layers and connectors located on the UBM layers.

20. The device according to claim 15, further comprising a package structure disposed on and electrically connected to the conductive connector.

* * * * *